United States Patent [19]
Wu

[11] Patent Number: 5,972,762
[45] Date of Patent: Oct. 26, 1999

[54] METHOD OF FORMING MOSFETS WITH RECESSED SELF-ALIGNED SILICIDE GRADUAL S/D JUNCTION

[75] Inventor: Shye-Lin Wu, Hsinchu, Taiwan

[73] Assignee: Texas Instruments—Acer Incorporated, Hsinchu, Taiwan

[21] Appl. No.: 09/002,608

[22] Filed: Jan. 5, 1998

[51] Int. Cl.$^6$ .................................................. H01L 21/336
[52] U.S. Cl. .......................... 438/305; 438/524; 438/636; 438/655
[58] Field of Search ...................... 438/303, 305, 438/306, 307, 524, 636, 655, 664

[56] References Cited

U.S. PATENT DOCUMENTS

| | | | |
|---|---|---|---|
| 4,963,502 | 10/1990 | Teng et al. | 438/303 |
| 5,382,534 | 1/1995 | Sheu et al. | 438/524 |
| 5,491,099 | 2/1996 | Hsu | 438/305 |
| 5,798,291 | 8/1998 | Lee et al. | 438/307 |

*Primary Examiner*—Chandra Chaudhari
*Attorney, Agent, or Firm*—Harness, Dickey & Pierce, P.L.C.

[57] ABSTRACT

A gate oxide layer is formed on the substrate. A polysilicon layer is deposited on the gate oxide layer. Then, a ARC layer is deposited on the polysilicon layer. Next, etching is used to etch the ARC layer, polysilicon layer for forming a gate structure. An ion implantation is carried out to form lightly doped drain (LDD). Subsequently, a silicon nitride layer is formed along the surface of substrate, and the gate structure. Then, side wall spacers are formed on the side walls of the gate structure. The silicon substrate is slightly recessed to generate recess portions under a portion of the side wall spacers. Then, an ion implantation is performed to form source and drain (S/D). Then, the silicon nitride layer formed on the gate and the side wall spacers are removed. Subsequently, the gate oxide is etched to form undercut portions under the gate. Subsequently, a silicon oxynitride layer is formed on the substrate, and the gate structure. Side wall spacers are formed on the side walls of the gate structure. Self-aligned silicide (SALICIDE) layer, polycide layer are respectively formed on the S/D, and on the polysilicon gate.

27 Claims, 3 Drawing Sheets

METHOD OF FORMING MOSFETS WITH RECESSED SELF-ALIGNED SILICIDE GRADUAL S/D JUNCTION

The present invention relates to a semiconductor device, and more specifically, to a method of fabricating a metal oxide semiconductor field effect transistor (MOSFET) for used in integrated circuits.

BACKGROUND OF THE INVENTION

Metal oxide semiconductor field effect transistor (MOSFET) is one of the important devices for integrated circuits. As the trend of the integrated circuits, the fabrication of the MOSFET also meets various issues to fabricate them. The typically issue that relates to hot carriers injection is overcame by the development of lightly doped drain (LDD) structure. However, when the transistor is scaled down to sub-micron range, the transistor suffers the hot electron problem again. It is because that the transistor has short channel length and high supply power. The electric field strength in the devices is increased, thus the energetic electrons will inject into the silicon-oxide interface and be trapped within the gate oxide. Wei has suggested a buried and graded LDD structure to improve the hot electron reliability as seen in the article "Buried and Graded/Buried LDD Structure for Improved Hot-Electron Reliability, Ching-Yeu Wei, IEEE Electron Device Lett., 1986".

Lo has proposed a method to suppress the hot carrier induced degradation. In this technique, gate oxide is grown in pure $N_2O$ ambient at 950 degrees centigrade. It reports that the $N_2O$ gate oxide has significantly enhanced hot carrier immunity. Further, under the Fowler-Nordheim injection stress, the devices show an enhanced degradation with decreasing channel length and increasing channel width. Please see "Dependence of Hot-Carrier Immunity on Channel Length and Channel Width in MOSFET's with $N_2O$-Grown Gate Oxides, G. Q. Lo, et al., IEEE, Electron Device Lett.,1992".

In addition, the requirement of the devices towards high operation speed and low operation power. For deep sub-micron meter MOS devices, the self-aligned silicide (SALICIDE) contact, ultra-shallow source and drain junction are used for improving the operation speed and short channel effect as seen in reference "High Performance 0.15 $\mu$m Single Gate Co Salicide CMOS, T. Yoshitomi et al., 1996, Symposium on VLSI Technology Digest of Technical papers". The conventional $TiSi_2$ suffers a serious problem relating to the sheet resistance increase of the fine line. Thus, in the technology, the $CoSi_2$, NiSi have been used for deep sub-micron high speed CMOS due to the low sheet resistance of fine silicide line. The MOSFETs have extension region to suppress the short channel effect and achieve the high speed operation.

Another issue is relating to the supply power of the devices. When the supply-voltage is reduced, the threshold voltage needs to be scaled down to achieve the desired circuit switching speed. IBM has proposed that CMOS employs non-uniform channel doping profiles and ultra-shallow source and drain extensions and halos, which can be referenced in "CMOS technology scaling 0.1 $\mu$m and beyond, IBM semiconductor research and development center, Bijan , Davari, IEDM, 96-555, 1996". For the high performance case, the threshold voltage is scaled down less than the supply voltage in order to maintain a reasonable standby current.

Further, in order to achieve the purpose of the present invention, an anti-reflective coating technology is used to improve the resolution of lithography. This can reference to the article "CVD $SiN_x$ Anti-reflective Coating for Sub-0.5 $\mu$m Lithography, T. P. Ong, 1995, Symposium on VLSI Technology Digist of Technical Papers". The $SiN_x$ material can provide excellent anti-reflective layer that meets the requirement of the advanced integrated circuits. This material also be introduced into SRAM as the bottom anti-reflective coating (BARC). In addition, the present invention uses an etchant suggested by Mitani to form a recess portion of silicon substrate. The etchant exhibits high selectivity to silicon oxide for etching, and low damage for silicon. Please see "Buried Source and Drain (BSD) Structure for Ultra-shallow Junction Using Selective Deposition of Highly Doped Amorphous Silicon, Y. Mitani, 1996, Symposium on VLSI Technology Digist of Technical Papers".

SUMMARY OF THE INVENTION

The method of the present invention includes forming a thin gate oxide layer on the substrate. Subsequently, a polysilicon layer is deposited on the gate oxide layer. Then, a silicon nitride layer ($SiN_x$) is deposited on the polysilicon layer to act as an anti-reflective coating (ARC) layer to improve the resolution of lithography. Next, etching is used to etch the ARC layer, polysilicon layer for forming a gate structure. An ion implantation is carried out to form lightly doped drain (LDD) adjacent to the gate structure.

Subsequently, a silicon nitride layer is formed along the surface of substrate, and substantially conformally covered the gate structure. In a case, the silicon nitride layer is formed by chemical vapor deposition. Then, an anisotropical etching is used to etch the silicon nitride layer, thereby generating side wall spacers on the side walls of the gate structure. The silicon substrate is slightly recessed by chemical dry etching (CDE) to generate recess portions under a portion of the side wall spacers.

Then, an ion implantation is performed to implant ions in to the gate, the substrate for forming source and drain (S/D). The S/D exhibits gradual junctions due to the substrate having the recessed portions. This S/D structure having recessed gradual S/D junctions will improve the short channel effect. Then, the silicon nitride layer formed on the gate and the side wall spacers are removed to expose the gate structure. Subsequently, diluted HF solution is used to remove the fringe portion of the gate oxide, thereby forming undercut portions under the gate. Subsequently, a ultra-thin silicon oxynitride layer is formed on the substrate, and substantially conformally covered the gate structure. The silicon oxynitride layer is also refilled into the undercut portions. An oxide layer is formed over the substrate and gate structure. Then, an anisotropical etching is performed to etch the CVD oxide. Side wall spacers are formed on the side walls of the gate structure. Self-aligned silicide (SALICIDE) layer, polycide layer are respectively formed on the S/D, and on the polysilicon gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
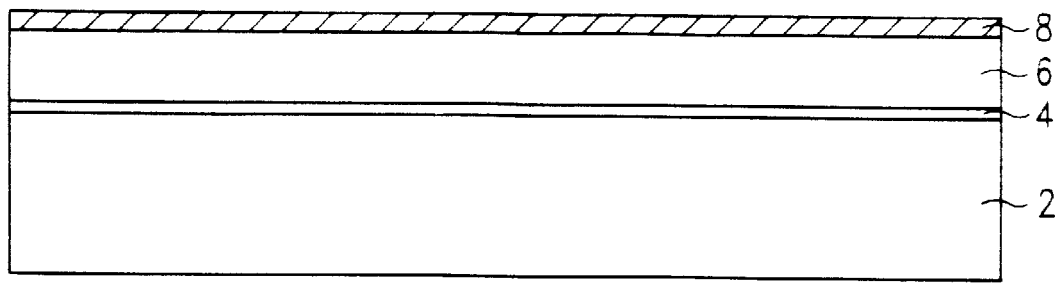
FIG. 1 is a cross section view of a semiconductor wafer illustrating the steps of forming a gate oxide, polysilicon layer and a silicon nitride layer on a semiconductor substrate according to the present invention.

The present invention proposes a novel method to fabricate a MOSFET with recessed self-aligned silicide gradual source and drain (S/D) junctions. In the present invention, the device operation speed can be increased by using the SALICIDE technology. The short channel effect can be suppressed by using the recessed gradual source and drain (S/D) junction. Further, the present invention uses the $N_2O$ silicon oxynitride layer as gate dielectric. The detail description according to the present invention will be seen as follows.

In a preferred embodiment, a single crystal silicon substrate 2 with a <100> crystallographic orientation is provided. A thin gate oxide layer 4 consisted of silicon oxide is formed on the substrate 2 Typically, the gate oxide 4 can be grown in oxygen ambient at a temperature of about 700 to 1100 degrees centigrade. Other method, such as chemical vapor deposition, can also be used to form the gate oxide 4. In the embodiment, the thickness of the silicon dioxide layer 6 is approximately 15–250 angstroms. Subsequently, a polysilicon layer 6 is deposited on the gate oxide layer 4. Generally, the polysilicon layer 6 can be chosen from doped polysilicon or in-situ polysilicon. For an embodiment, the doped polysilicon layer 10 is doped by phosphorus using a $PH_3$ source. Then, a silicon nitride layer ($SiN_x$) 8 is deposited on the polysilicon layer 6 to act as an anti-reflective coating (ARC) layer to improve the resolution of lithography. The silicon nitride layer 8 can be deposited by any suitable process. As known by a person of ordinary skills in the art, the silicon nitride layer 8 can be formed using Low Pressure Chemical Vapor Deposition (LPCVD), Plasma Enhance Chemical Vapor Deposition (PECVD), and so. Further, the temperature forming the silicon nitride layer 8 is at a range of 400–800° C. In the preferred embodiment, the reaction gases of the step to form silicon nitride layer 26 are $SiH_4$, $NH_3$, $N_2$, $N_2O$ or $SiH_2Cl_2$, $NH_3$, $N_2$, $N_2O$.

Figure 2:
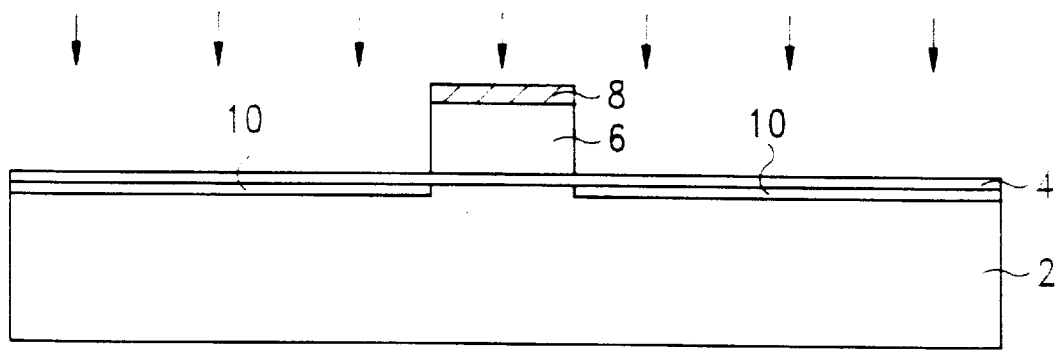
FIG. 2 is a cross section view of a semiconductor wafer illustrating the steps of forming a gate structure and LDD structure according to the present invention.

Next, referring to FIG. 2, standard lithography and etching steps are used to etch the ARC layer 8, polysilicon layer 8 to the surface of the gate oxide layer 4 for forming a gate structure consisting of the gate oxide layer 4 and the polysilicon layer 6. An ion implantation is carried out to dope dopant in to the substrate 2 by using the gate structure as a mask. In this step, lightly doped drain (LDD) 10 is formed adjacent to the gate structure to reduce the hot carriers. The dosage and the ion implantation energy of the step are respectively about 5E12 to 5E14 atoms/$cm^2$, about 5 to 80 KeV. The gate oxide 4 is also act as a buffer during the ion implantation.

Figure 3:
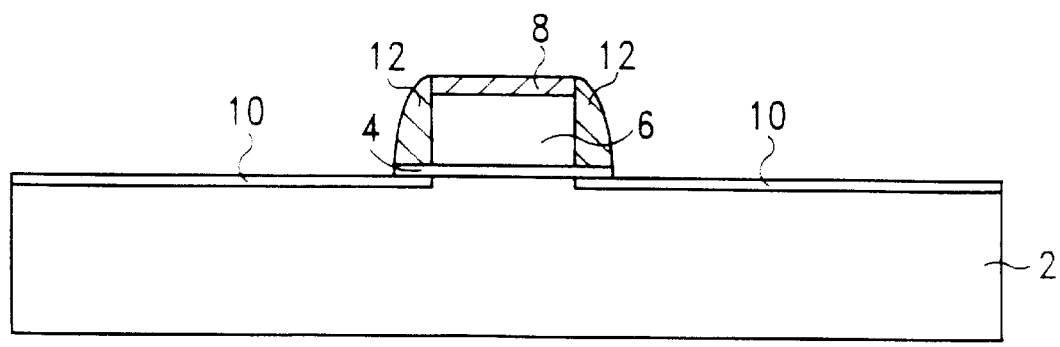
FIG. 3 is a cross section view of a semiconductor wafer illustrating the step of forming side wall spacers on the side walls of the gate structure according to the present invention.

Subsequently, please see FIG. 3, a silicon nitride layer 12 is formed along the surface of substrate 2, and substantially conformally covered the gate structure. In a case, the silicon nitride layer is formed by chemical vapor deposition. Then, an anisotropical etching is used to etch the silicon nitride layer, thereby generating side wall spacers 12 on the side walls of the gate structure. As well known in the art, the etchant to etch the silicon nitride can be chosen from $CF_4/H_2$, $CHF_3$, $CH_3CHF_2$. By the way, the gate oxide layer 4 that is exposed by the gate structure is also removed during the etching.

Figure 4:
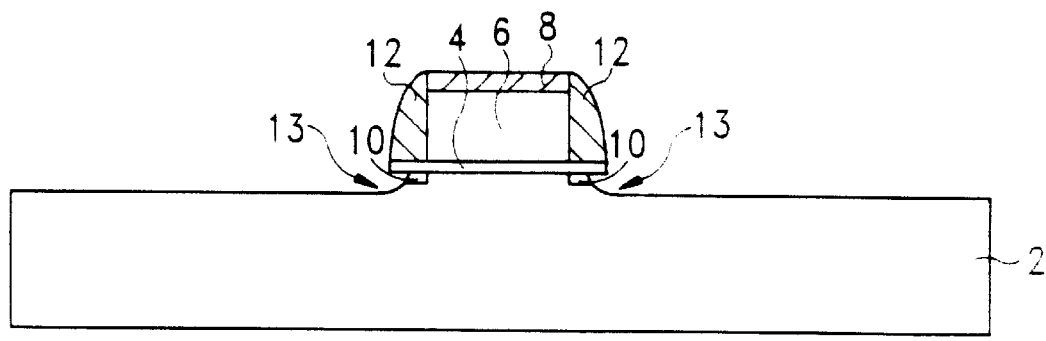
FIG. 4 is a cross section view of a semiconductor wafer illustrating the step of slightly recess the substrate according to the present invention.

Turning to FIG. 4, the silicon substrate 2 is slightly recessed by chemical dry etching (CDE) to generate recess portions 13 under a portion of the side wall spacers 12. Further, the substrate 2 that is used to form the S/D region is also recessed. Preferably, an etching technique with fluorine radicals is used to attack the silicon substrate 2. This method has high selectivity to silicon oxide, isotropy for etching the silicon substrate 2 under the side wall spacers 12. Another benefit of this technique is low damage for silicon, which is referred to soft dry etching. Portions of LDD structure 10 is still remained in the substrate under the side wall spacers 12.

Figure 5:
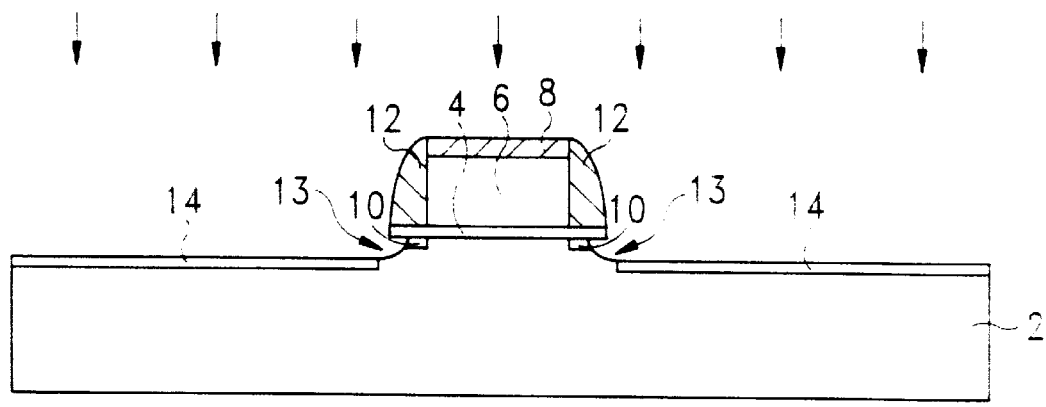
FIG. 5 is a cross section view of a semiconductor wafer illustrating the step of forming source and drain according to the present invention.

Then, an ion implantation is performed to implant ions into the gate, the substrate using the gate structure, the side wall spacers 12 as a mask to form source and drain (S/D) 14 in the recessed semiconductor substrate, as shown in FIG. 5. In the preferred embodiment, low energy and high dose ion implantation is introduced in this step. Thus, the S/D 14 has shallow junctions. Preferably, the dosage and energy of the ion implantation are respectively about 1E14 to 1E16 atoms/$cm^2$, about 1 to 40 KeV. The S/D 14 exhibits gradual junctions due to the substrate 2 owns the recessed portions. This S/D structure having recessed gradual S/D junctions will improve the short channel effect.

Figure 6:
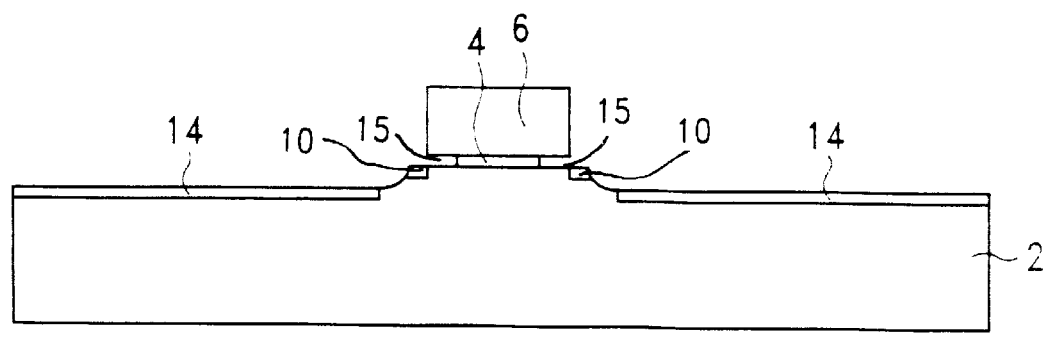
FIG. 6 is a cross section view of a semiconductor wafer illustrating the step of removing silicon nitride layer according to the present invention.

Turning to FIG. 6, the silicon nitride layer 8 formed on the gate 8 and the side wall spacers 12 are removed to expose the gate structure. Typically, the silicon nitride can be stripe by using hot phosphorus acid solution. Subsequently, diluted HF solution is used to remove the fringe portion of the gate oxide 4, thereby forming undercut portions 15 under the gate 6.

Figure 7:
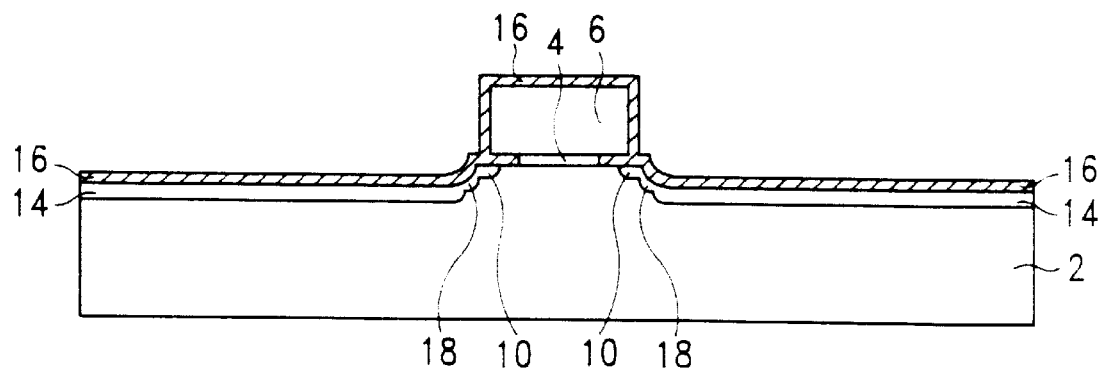
FIG. 7 is a cross section view of a semiconductor wafer illustrating the step of forming a silicon oxynitride layer according to the present invention.

Referring to FIG. 7, subsequently, a ultra-thin silicon oxynitride layer 16 is formed on the substrate 2, and substantially conformally covered the gate structure. The silicon oxynitride layer is also refilled into the undercut portions 15. In a case, the silicon oxynitride layer 16 is formed by thermal oxidation in $N_2O$ or NO environment. The temperature for forming the silicon oxynitride layer 16 ranges from 700 to 1150 centigrade degrees. The thickness of the silicon oxynitride layer 16 is about 30 to 300 angstroms. The silicon oxynitride layer 16 will suppress the hot carrier induced degradation. The undercut portions refilled with the silicon oxynitride layer 16 to act as a portion of the gate oxide. Thus, the gate oxide has significantly enhanced hot carrier immunity. As well known in the art, the etching and ion implantation will cause substrate damage. Thus, the thermal oxidation used to form the silicon oxynitride layer 16 will recover the surface damage of the substrate 2. It has to be noted that extended S/D 18 is also formed between the S/D 14 and the LDD 10 by the thermal oxidation.

Figure 8:
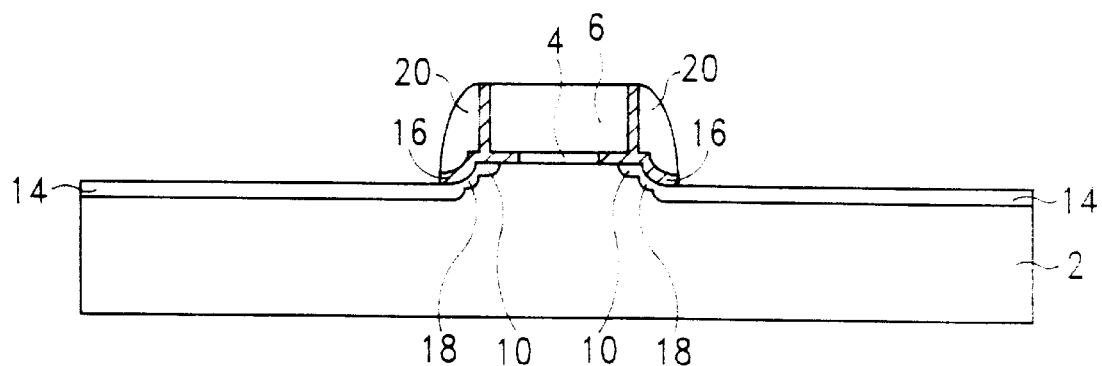
FIG. 8 is a cross section view of a semiconductor wafer illustrating the step of forming a CVD side wall spacers according to the present invention.

Referring to FIG. 8, an oxide layer 20 is formed over the substrate 2 and gate structure. For example, CVD oxide can be used for in this step. Then, an anisotropical etching is performed to etch the CVD oxide 20. As known in the art, side wall spacers 20 are formed on the side walls of the gate structure.

Figure 9:
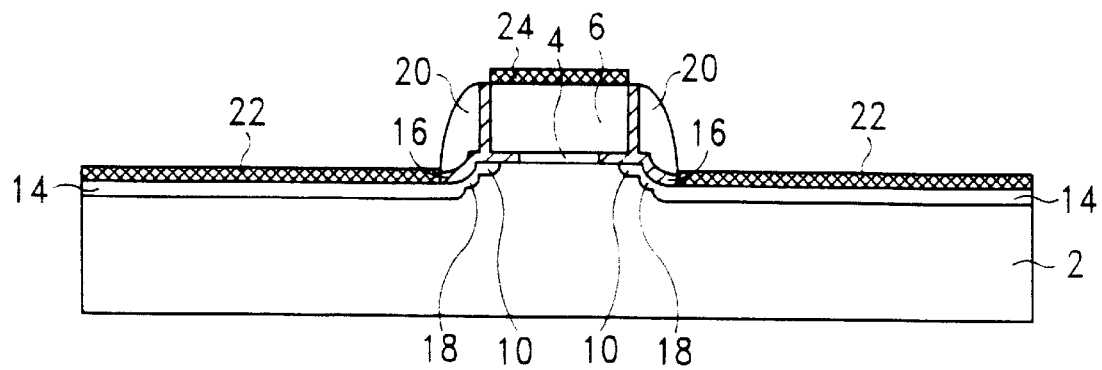
FIG. 9 is a cross section view of a semiconductor wafer illustrating the step of forming self-aligned silicide according to the present invention.

As shown in FIG. 9, self-aligned silicide (SALICIDE) layer 22, polycide layer 24 are respectively formed on the S/D 14, and on the polysilicon gate 6. Typically, this can be achieved by using well known processes. For example, a refractory metal layer, such as Ti, Pt, Co, W, Ni etc, is sputtered on the substrate 2, gate structure. Then, a first-step rapid thermal annealing (RTA) at 350 to 700 degrees centigrade in $N_2$ ambient is performed to react the refractory metal with the polysilicon gate 6 and the silicon substrate 2, thereby forming silicide on these portions. Then, a strip step is used to remove non-reactive refractory metal on the CVD side wall spacers 20. Therefore, the SALICIDE layer 22, polycide layer 24 are self-aligned formed on these regions. Further, the dopants in the S/D 14 are driven deeper into the substrate 2 to expanse the S/D 14 by another high temperature RTA. The temperature of the second-step RTA is about 800–1100 degrees centigrade. The self-aligned silicide contact will increase the operation speed of the devices.

The present invention can provide various benefits over the prior art. For example, the operation speed will be increased by the SALICIDE technology. The short channel effect will be suppressed by using the gradual S/D junctions, and the extended ultra-shallow S/D junction.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a transistor with recessed self-aligned silicide gradual source and drain junctions on a semiconductor substrate, said method comprising the steps of:

forming a gate oxide layer on said semiconductor substrate;

forming a polysilicon layer on said gate oxide layer;

forming an anti-reflective coating (ARC) layer on said polysilicon layer;

patterning said ARC layer, said polysilicon layer to form a polysilicon gate;

performing a first ion implantation using said gate structure as a mask to form lightly doped drain (LDD) structure in said semiconductor substrate adjacent to said polysilicon gate;

forming a first dielectric layer on said semiconductor substrate and said polysilicon gate;

performing a first etching to etch said first dielectric layer, thereby forming first side wall spacers on the side walls of said polysilicon gate, a portion of said gate oxide exposed by said polysilicon gate being removed by said first etching;

recessing said semiconductor substrate to have recess portions under said first side wall spacers, wherein said LDD structure remaining under said first side wall spacers;

performing a second ion implantation using said gate structure, said first side wall spacers as a mask to form source and drain in said recessed semiconductor substrate;

removing said ARC layer and said first side wall spacers to expose said polysilicon gate;

etching a portion of said gate oxide layer to form undercut portions of said gate oxide, said undercut portions being under said polysilicon gate;

forming a silicon oxynitride layer by thermal oxidation on said gate structure, said recessed semiconductor substrate and refilled into said undercut portions, wherein said oxidation generates extended source and drain between said LDD structure, and said S/D, thus said transistor having recessed gradual source and drain junctions;

forming a second dielectric layer on said silicon oxynitride layer;

performing a second etching to etch said second dielectric layer, thereby generating a second side wall spacers on the side walls of said polysilicon gate;

forming a conductive layer on said gate structure, said recessed semiconductor substrate and said side wall spacers; and performing a rapid thermal annealing (RTA) process to react said conductive layer with said semiconductor substrate, said polysilicon gate, thereby respectively forming self-aligned silicide and polycide thereon.

2. The method of claim 1, wherein said first dielectric layer comprises silicon nitride.

3. The method of claim 2, wherein said first side wall spacers are removed by hot phosphorus acid solution.

4. The method of claim 1, wherein said ARC layer comprises $SiN_x$.

5. The method of claim 4, wherein said ARC layer is removed by hot phosphorus acid solution.

6. The method of claim 1, wherein said second dielectric layer comprises oxide.

7. The method of claim 1, wherein said silicon oxynitride dielectric layer is formed in $N_2O$ ambient.

8. The method of claim 7, wherein said silicon oxynitride dielectric layer is formed at a temperature about from 700 to 1150 centigrade degrees.

9. The method of claim 1, wherein said silicon oxynitride dielectric layer is formed in NO ambient.

10. The method of claim 9, wherein said silicon oxynitride dielectric layer is formed at a temperature about from 700 to 1150 centigrade degrees.

11. The method of claim 1, wherein said semiconductor substrate is recessed by using an etching technique with fluorine radicals.

12. The method of claim 1, wherein said undercut portions is formed by using diluted HF solution.

13. The method of claim 1, wherein said conductive layer is chosen from Ti, Pt, Co, W and Ni.

14. The method of claim 1, wherein said first ion implantation is performed with a dosage and an energy about 5E12 to 5E14 atoms/cm$^2$ and about 5 to 80 KeV, respectively.

15. The method of claim 1, wherein said second ion implantation is performed with a dosage and an energy about 1E14 to 1E16 atoms/cm$^2$ and about 1 to 40 KeV, respectively.

16. A method for manufacturing a transistor with recessed self-aligned silicide gradual source and drain junctions on a semiconductor substrate, said method comprising the steps of:

forming a gate oxide layer on said semiconductor substrate;

forming a polysilicon layer on said gate oxide layer;

forming a first silicon nitride layer on said polysilicon layer as an anti-reflective coating (ARC) layer;

patterning said ARC layer, said polysilicon layer to form a polysilicon gate;

performing a first ion implantation using said gate structure as a mask to form lightly doped drain (LDD) structure in said semiconductor substrate adjacent to said polysilicon gate;

forming a second silicon nitride layer on said semiconductor substrate and said polysilicon gate;

performing a first etching to etch said second silicon nitride layer, thereby forming first side wall spacers on the side walls of said polysilicon gate, a portion of said gate oxide exposed by said polysilicon gate being removed by said first etching;

recessing said semiconductor substrate to have recess portions under said first side wall spacers, wherein said LDD structure remaining under said first side wall spacers;

performing a second ion implantation using said gate structure, said first side wall spacers as a mask to form source and drain in said recessed semiconductor substrate;

removing said ARC layer and said first side wall spacers to expose said polysilicon gate;

etching a portion of said gate oxide layer to form undercut portions of said gate oxide, said undercut portions being under said polysilicon gate;

forming a silicon oxynitride layer by thermal oxidation on said gate structure, said recessed semiconductor substrate and refilled into said undercut portions, wherein said oxidation generates extended source and drain between said LDD structure, and said S/D, thus said transistor having recessed gradual source and drain junctions;

forming an oxide layer on said silicon oxynitride layer;

performing a second etching to etch said oxide layer, thereby generating a second side wall spacers on the side walls of said polysilicon gate;

forming a conductive layer on said gate structure, said recessed semiconductor substrate and said side wall spacers; and performing a rapid thermal annealing (RTA) process to react said conductive layer with said semiconductor substrate, said polysilicon gate, thereby respectively forming self-aligned silicide and polycide thereon.

17. The method of claim 16, wherein said first side wall spacers are removed by hot phosphorus acid solution.

18. The method of claim 16, wherein said ARC layer is removed by hot phosphorus acid solution.

19. The method of claim 16, wherein said silicon oxynitride dielectric layer is formed in $N_2O$ ambient.

20. The method of claim 19, wherein said silicon oxynitride dielectric layer is formed at a temperature about from 700 to 1150 centigrade degrees.

21. The method of claim 16, wherein said silicon oxynitride dielectric layer is formed in NO ambient.

22. The method of claim 21, wherein said silicon oxynitride dielectric layer is formed at a temperature about from 700 to 1150 centigrade degrees.

23. The method of claim 16, wherein said semiconductor substrate is recessed by using an etching technique with fluorine radicals.

24. The method of claim 16, wherein said undercut portions is formed by using diluted HF solution.

25. The method of claim 16, wherein said conductive layer is chosen from Ti, Pt, Co, W and Ni.

26. The method of claim 16, wherein said first ion implantation is performed with a dosage and an energy about 5E12 to 5E14 atoms/cm$^2$ and about 5 to 80 KeV, respectively.

27. The method of claim 16, wherein said second ion implantation is performed with a dosage and an energy about 1E14 to 1E16 atoms/cm$^2$ and about 1 to 40 KeV, respectively.

* * * * *